(12) United States Patent
Inabe

(10) Patent No.: US 7,772,344 B2
(45) Date of Patent: Aug. 10, 2010

(54) INSULATING FILM-FORMING COMPOSITION

(75) Inventor: Haruki Inabe, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 12/235,442

(22) Filed: Sep. 22, 2008

(65) Prior Publication Data

US 2009/0118458 A1    May 7, 2009

(30) Foreign Application Priority Data

Sep. 28, 2007   (JP) .............................. 2007-253891

(51) Int. Cl.
 C08F 38/00   (2006.01)
 C07C 41/30   (2006.01)
 H01L 23/58   (2006.01)

(52) U.S. Cl. ....................... 526/333; 526/280; 526/285; 526/309; 568/636; 257/632

(58) Field of Classification Search ................. 526/280, 526/285, 309, 333; 585/25; 568/635, 636; 257/632

See application file for complete search history.

(56) References Cited

U.S. PATENT DOCUMENTS 5,965,679 A * 10/1999 Godschalx et al. .......... 526/281

2007/0027280 A1   2/2007 Hahnfeld et al.

FOREIGN PATENT DOCUMENTS

JP  2000-191752 A    7/2000
JP  2006-525413 A    11/2006

OTHER PUBLICATIONS

Kumar et al, Diels-Alder Polymerization between Bis(cyclopentadienones) and Acetylenes. A Versatile Route to New Highly Aromatic Polymers, Macromolecules, 1995, 28, 124-130.*
Stille, Diels-Alder Polymerizations. IV. Polymers Containing Short Phenylene Blocks Connected by Alkylene Units, Macromolecules, 1968, 1(5), 431-436.*

* cited by examiner

*Primary Examiner*—Fred M Teskin
(74) *Attorney, Agent, or Firm*—Sughrue Mion, PLLC

(57) ABSTRACT

It is an object of the present invention to provide a composition capable of forming an insulating film which is endowed with a low dielectric constant, heat resistance, chemical resistance and a high mechanical strength that enables the insulating film to withstand CMP, and which, when an inorganic insulating film layer is provided thereon as an overlying layer, has a high adherence thereto. The composition for forming an insulating film contains polyphenylene, wherein the polyphenylene in an insulating film formed from the composition has a number of carbon atoms (C) and a number of oxygen atoms (O) which together satisfy a condition $O/(C+O) \geq 0.050$. With the composition, the above object is attained.

3 Claims, No Drawings

INSULATING FILM-FORMING COMPOSITION

The entire contents of all documents cited in this specification are incorporated herein by reference.

BACKGROUND OF THE INVENTION

The present invention relates to an insulating film-forming composition capable of forming an insulating film which has good film properties such as dielectric constant, mechanical strength and heat resistance, and which can be used in electronic devices and other applications.

Recent advances in the levels of integration, functionality and performance of semiconductor integrated circuits (IC) have led to increases in circuit resistance and capacitance between interconnects, and to increases in power consumption and delay time. Of these, because an increase in the delay time lowers the signal speed of semiconductor integrated circuits and leads to crosstalk, a lower interconnect resistance and a lower parasitic capacitance are desired in order to shorten the delay time and thus increase the speed of the semiconductor integrated circuit. One specific approach for lowering the parasitic capacitance currently being tried is to cover the periphery of the interconnects with a low-dielectric insulating film. In addition, it is desired that such an insulating film have an excellent heat resistance capable of withstanding the thin film-forming operation during mounting board production and subsequent operations such as chip connection and pin attachment, and a chemical resistance capable of withstanding wet processes. Moreover, in recent years, increasing use is being made of low-resistance copper interconnects in place of aluminum interconnects; with this transition, planarization using a chemical-mechanical polishing (CMP) process has become commonplace. A high mechanical strength capable of withstanding the CMP process is thus desired.

Silicon dioxide ($SiO_2$, dielectric constant (k)=3.9) has hitherto been used as the insulating film to cover the periphery of interconnects. However, to achieve a lower dielectric constant in the insulating film, investigations are being conducted on the use of spin-coated dielectric films which have a film structure that is relatively easy to control and thus enable a lower dielectric constant to be readily achieved.

For example, JP 2000-191752 A and JP 2006-525413 A disclose low-dielectric constant insulating film-forming, coating materials composed primarily of polyphenylene-based organic polymers.

SUMMARY OF THE INVENTION

When such an insulating film composed primarily of a polyphenylene-based organic polymer is used in the multilayer structure of a semiconductor integrated circuit, an inorganic insulating film such as silicon dioxide ($SiO_2$), carbon-containing silicon oxide (SiOC), silicon nitride (SiN) or silicon carbide (SiC) film formed by a chemical vapor deposition (CVD) or a coating process is often provided as the overlying layer thereon. In such cases, adherence to the overlying inorganic insulating film must be good, the reason being that a poor adherence may give rise to problems such as delamination at the interface between the polyphenylene-based organic polymer layer and the inorganic insulating film layer during the subsequent CMP polishing process. Hence, when an inorganic insulating film has been provided as the overlying layer on the polyphenylene-based organic polymer material, it is preferable for the adherence therebetween to be good.

It is therefore an object of the present invention to provide a composition capable of forming an insulating film which is endowed with a low dielectric constant, heat resistance, chemical resistance and a high mechanical strength that enables the insulating film to withstand CMP, and which, when an inorganic insulating film layer is provided thereon as an overlying layer, has a high adherence thereto.

As a result of extensive investigations, the inventor has discovered that the foregoing objects of the invention can be achieved with an insulating film-forming composition which contains a polyphenylene, wherein the polyphenylene in an insulating film formed from the composition has a number of carbon atoms and a number of oxygen atoms that together satisfy a specific condition. The invention has been thus completed.

Accordingly, the invention provides the following compositions (1) to (6).

(1) A composition for forming an insulating film containing polyphenylene, wherein the polyphenylene in an insulating film formed from the composition has a number of carbon atoms (C) and a number of oxygen atoms (O) which together satisfy a condition $O/(C+O) \geq 0.050$.

(2) The composition of (1) above, wherein the polyphenylene is a compound formed by a Diels-Alder reaction between a diene group-containing compound and a dienophile group-containing compound.

(3) The composition of (2) above, wherein one or both of a number of diene groups on the diene group-containing compound and a number of dienophile groups on the dienophile group-containing compound is at least 2.

(4) The composition of (2) above, wherein one or both of the diene group-containing compound and the dienophile group-containing compound contain ether groups such that the diene group-containing compound and the dienophile group-containing compound together contain a total number of at least 4 ether groups.

(5) The composition of (4) above, wherein each of the ether groups is methoxy group, phenyl ether group or trifluoromethyl ether group.

(6) The composition of (5) above, wherein each of the ether groups is methoxy group.

The insulating film-forming composition of the invention is able to form an insulating film which has a low dielectric constant, heat resistance, chemical resistance, and a high mechanical strength that enables the insulating film to withstand CMP, and which, when an inorganic insulating film layer is provided thereon as an overlying layer, has a high adherence thereto.

DETAILED DESCRIPTION OF THE INVENTION

The present invention relates to a composition for forming a polyphenylene-containing insulating film, wherein the polyphenylene in an insulating film formed from the composition has a number of carbon atoms (C) and a number of oxygen atoms (O) which together satisfy the condition $O/(C+O) \geq 0.050$.

Such compositions are also referred to below as "the inventive composition."

Polyphenylene

The polyphenylene included in the inventive composition (also referred to below as "the polyphenylene of the invention") is described.

The polyphenylene of the invention is not subject to any particular limitation, provided it is a polyphenylene which is present in an insulating film formed from the inventive composition and has a number of carbon atoms (C) and a number of oxygen atoms (O) which together satisfy the condition O/(C+O)≧0.050.

The ratio O/(C+O) also is referred to below as "the oxygen ratio in the polyphenylene." The insulating film that can be formed from the inventive composition is also referred to as "the insulating film of the invention."

The oxygen ratio in the polyphenylene is preferably at least 0.055, and more preferably at least 0.060, but preferably not more than 0.200, more preferably not more than 0.150, and even more preferably not more than 0.100.

In the inventive composition, the oxygen ratio in the polyphenylene is defined as the value measured by the method shown below. The oxygen ratio in the polyphenylene is in fact difficult to determine by calculation because polyphenylene is a polymer and it has some degree of molecular weight distribution.

First, the target polyphenylene alone is completely dissolved in high-purity cyclohexanone so as to form a casting solution. Next, the casting solution is spin-coated onto a silicon wafer, after which it is baked on a hot plate at 110° C. for 60 seconds, baked on a hot plate at 200° C. for 60 seconds, then cured on a hot plate at 350° C. for 5 minutes in a low oxygen concentration (oxygen concentration, below 100 ppm) atmosphere, thereby giving an insulating film made of polyphenylene and having a film thickness of 100 nm. Here, "film thickness" refers to the value measured using an optical interference-type film thickness gauge.

Next, the number of carbon atoms ((C) atm %) and the number of oxygen atoms ((O) atm %) present in the resulting insulating film made of polyphenylene are measured using x-ray photoelectron spectroscopy (XPS). The x-ray source used at the time of XPS measurement was the Al—Kα line, and the x-ray angle of incidence was 45°.

The oxygen ratio in the polyphenylene was determined using these methods.

The polyphenylene of the invention is more preferably a polyphenylene formed by a Diels-Alder reaction between at least one diene group-containing compound and at least one dienophile group-containing compound. Here, the diene group, while not subject to any particular limitation, is preferably cyclopentadienone. Examples of dienophile groups include, but are not limited to, ethylene group, acetylene group and nitrile group. Acetylene group is preferred.

Also, in the polyphenylene of the invention, the number of diene groups in the diene group-containing compound is preferably at least two, and more preferably at least three.

The number of dienophile groups in the dienophile group-containing compound is preferably at least two, and more preferably at least three.

The number of diene groups in the diene group-containing compound and the number of dienophile groups in the dienophile group-containing compound are each preferably at least two, and more preferably at least three.

In the polyphenylene of the invention, the diene group-containing compound and/or the dienophile group-containing compound contain ether groups. The diene group-containing compound and the dienophile group-containing compound together contain a total number of preferably at least four, and more preferably at least five, ether groups. The types of ether groups are not subject to any particular limitation, provided the ether groups are inert ether groups which neither dissociate nor react with other functional groups, ambient moisture or the like in the course of the polyphenylene curing reaction during formation of the insulating film from the inventive composition. Preferred examples are methoxy group, phenyl ether group and trifluoromethyl ether group. Methoxy group is especially preferred. A plurality of ether groups within a single polyphenylene may all be of the same type or may be of different types.

The oxygen ratio in the polyphenylene may be adjusted by varying the number of ether oxygen atoms on the respective compounds that take part in the Diels-Alder reaction.

The polyphenylene of the invention is preferably an oligomer or polymer of any one of formulas (I) to (IV) below.

$$[A]_W[B]_T[E]_V \quad \text{Formula (I)}$$

In formula (I), A has the following structure

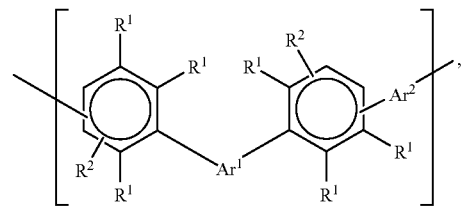

B has the following structure

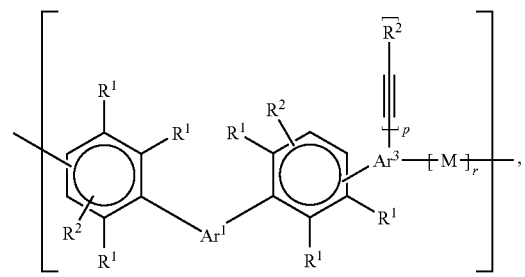

and E is an end group having one of the following structures

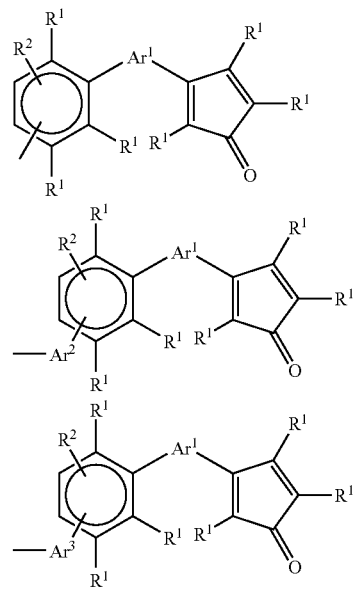

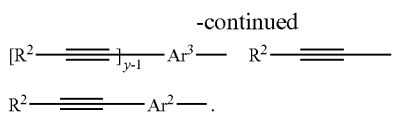

In the above chemical formulas, M represents a single bond, y is an integer which is 3 or higher, p is the number of unreacted acetylene groups in a monomer unit, r is a number which is one less than the number of reacted acetylene groups in a monomer unit, and p+r=y−1. Also, W is an integer from 0 to 1,000, T is an integer from 0 to 1,000, and V is an integer which is 2 or higher.

In formula (I), $R^1$ and $R^2$ are each independently hydrogen or an unsubstituted or inertly substituted aromatic moiety. $Ar^1$, $Ar^2$ and $Ar^3$ are each independently an unsubstituted or inertly substituted aromatic moiety.

Here, "aromatic moiety" is exemplified by phenyl, polyaromatic and condensed aromatic moieties.

"Inertly substituted" means that the substituent is substantially inert to the polymerization reaction between cyclopentadienone and acetylene, and does not readily react with ambient substances such as water under the conditions of use for the cured polymer in microelectronic devices. Examples of such substituents include F, Cl, Br, —$CF_3$, —$OCH_3$, —$OCF_3$, —OPh (where "Ph" represents a phenyl group), alkyls having 1 to 8 carbons, and cycloalkyls having 3 to 8 carbons. Of these, —$OCH_3$, —$OCF_3$ and —OPh are preferred because, by including an aromatic moiety substituted with an inert ether group, the oxygen ratio in the polyphenylene is readily set to at least 0.050.

Specific examples of inertly substituted aromatic moieties include the following.

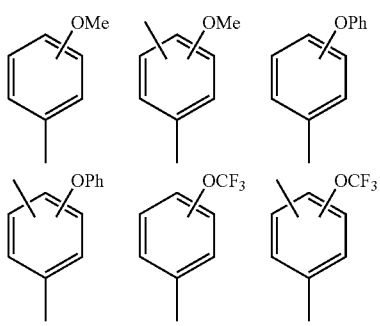

Here, "Me" represents a methyl group.

Specific examples of "unsubstituted aromatic moieties" include the following.

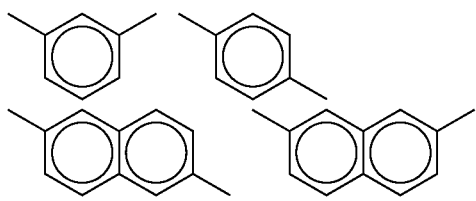

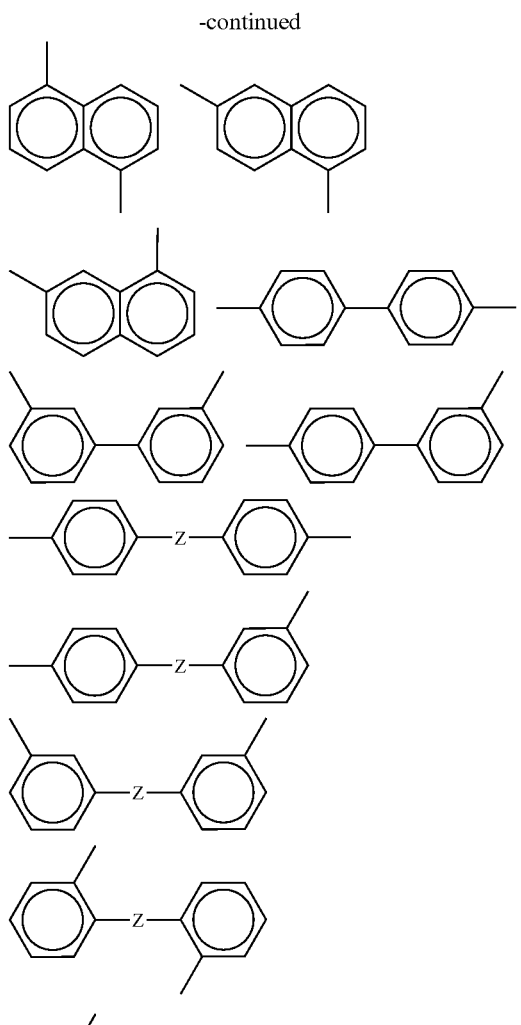

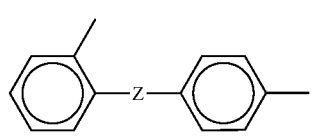

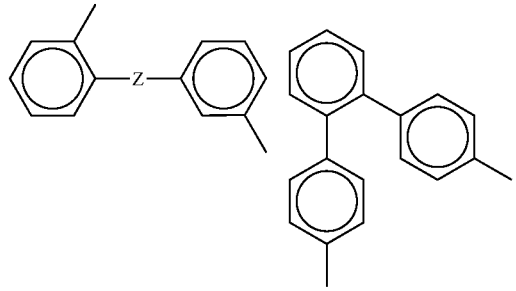

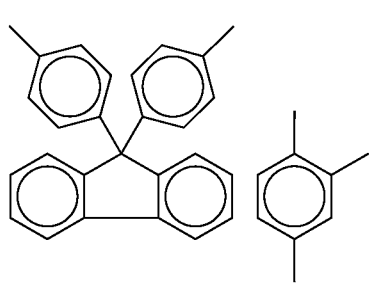

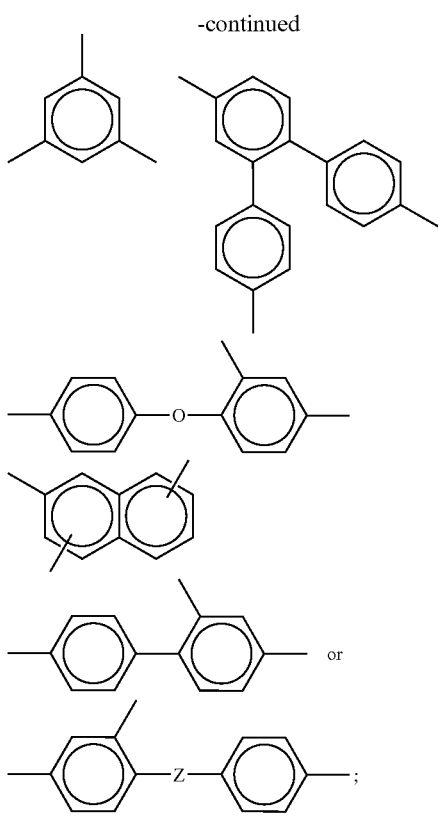

In the above formulas, Z represents a linkage group, examples of which include —O—, —S—, alkylene, —CF$_2$—, —CH$_2$—, —O—CF$_2$—, perfluoroalkyl and perfluoroalkoxy.

The oligomer or polymer represented by formula (I) above can be prepared by reacting the biscyclopentadienone of formula (a) below with the aromatic acetylene having three or more acetylene groups of formula (b) below. Here, if desired, a polyfunctional compound containing two aromatic acetylene moieties of formula (c) below may also be reacted.

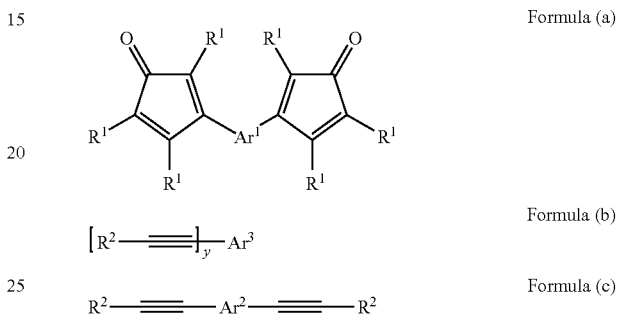

Formula (a)

Formula (b)

Formula (c)

In formulas (a) to (c), $R^1$, $R^2$, $Ar^1$, $Ar^2$, $Ar^3$ and y have the same meanings as in formula (I) above.

Next, the oligomer or polymer of formula (II) is described.

The polyphenylene of the invention is preferably an oligomer or polymer of formula (II) below.

Formula (II)

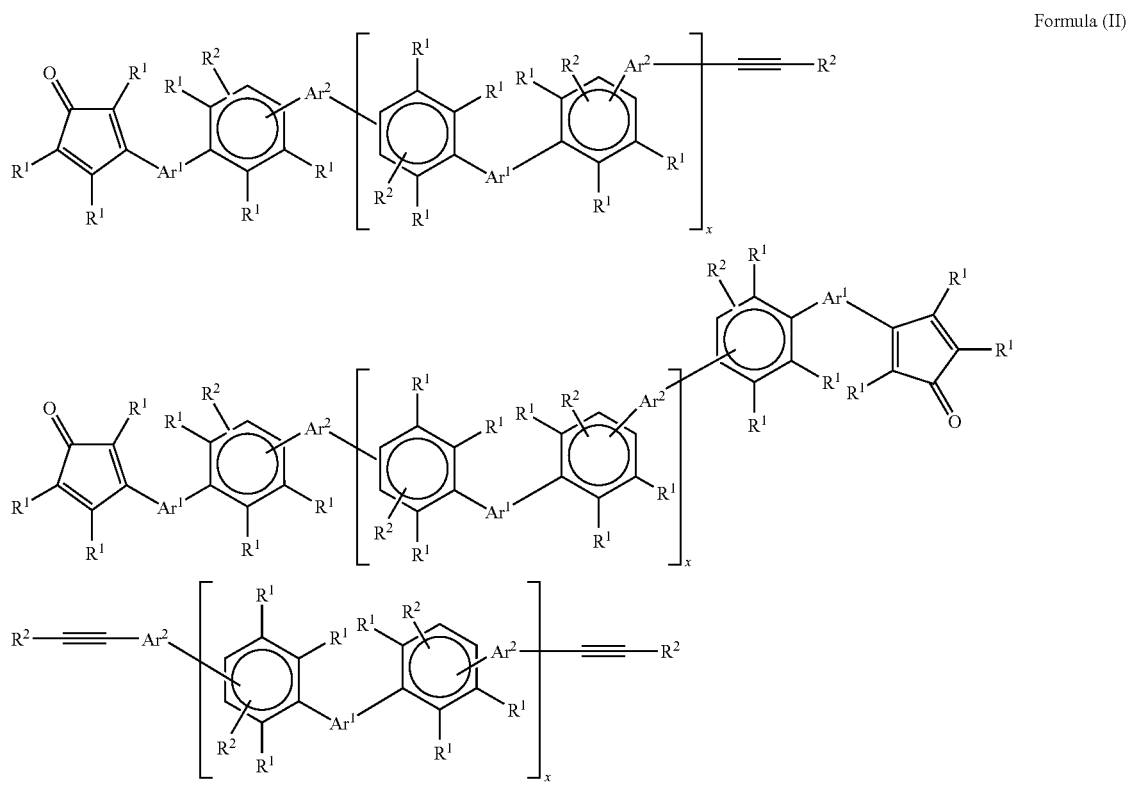

In formula (II), $R^1$, $R^2$, $Ar^1$ and $Ar^2$ have the same meanings as in formula (I) above. Moreover, X is an integer from 1 to 1,000, preferably an integer from 1 to 50, and more preferably an integer from 1 to 10.

The oligomer or polymer of formula (II) can be prepared by the reaction of formula (d) below between a biscyclopentadienone and a diacetylene.

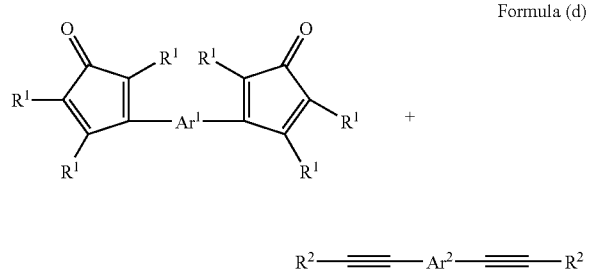

Formula (d)

In formula (d), $R^1$, $R^2$, $Ar^1$ and $Ar^2$ have the same meanings as in formula (I) above.

When obtaining an oligomer or polymer of formula (II) by the reaction between biscyclopentadienone and diacetylene of formula (d), it is preferable for the reaction to be carried out at a molar ratio of biscyclopentadienone to diacetylene in a range of from 1:1 to 1:3, and preferably from 1:1 to 1:2.

Next, the oligomer or polymer of formula (III) is described.

The polyphenylene of the invention is preferably an oligomer or polymer of formula (III) below.

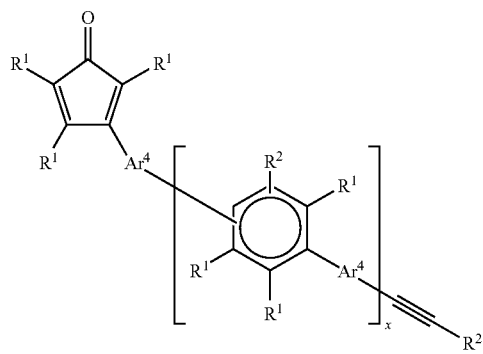

Formula (III)

In formula (III), $Ar^4$ represents, as do above-mentioned $Ar^1$, $Ar^2$ and $Ar^3$, an aromatic moiety or an inertly substituted aromatic moiety. Also, $R^1$ and $R^2$ have the same meanings as in formula (I) above, and X has the same meaning as in formula (II) above.

The oligomer or polymer represented by formula (III) is prepared by the reaction of the acetylene group and the cyclopentadienone group in the polyfunctional compound of formula (e) below.

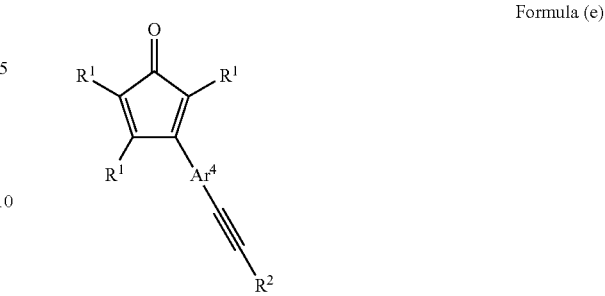

Formula (e)

In formula (e), $R^1$ and $R^2$ have the same meanings as in formula (I). Moreover, $Ar^4$ has the same meaning as in above formula (III).

Next, the oligomer or polymer of formula (IV) is described.

The polyphenylene of the invention is preferably an oligomer or polymer of formula (IV) below.

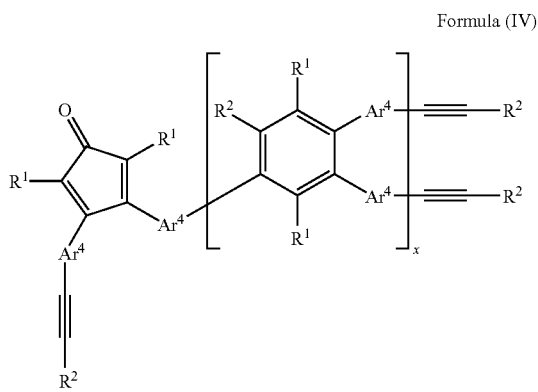

Formula (IV)

In formula (IV), $R^1$ and $R^2$ have the same meanings as in formula (I) above, $Ar^4$ has the same meaning as in formula (III) above, and X has the same meaning as in formula (II) above.

The oligomer or polymer shown in formula (IV) is prepared by a reaction between the acetylene group and the cyclopentadienone group in the polyfunctional compound of formula (f) below.

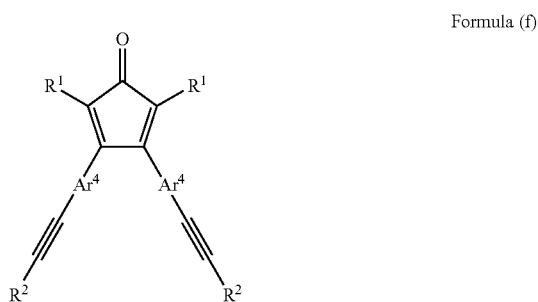

Formula (f)

In above formula (f), $R^1$ and $R^2$ have the same meanings as in formula (I) above, and $Ar^4$ has the same meaning as in formula (III) above.

Here, formula (a), the biscyclopentadienes of formula (d), formula (e) and formula (f) which are precursors of the polyphenylene shown in above formulas (I), (II), (III) and (IV), namely, the cyclopentadienone moiety-containing compounds may be prepared by the condensation of benzyl and benzyl ketone using conventional methods. Illustrative examples include the methods mentioned by Kumar et al. in *Macromolecules*, 1995, 28, 124-130, by Ogliaruso et al. in *J. Org. Chem.*, 1965, 30, 3354, by Ogliaruso et al. in *J. Org. Chem.*, 1963, 28, 2725, and in U.S. Pat. No. 4,400,540.

The precursors of the polyphenylene shown in formula (I) (formulas (b) and (c)), formula (II) (diacetylene in formula (d)), formula (III) (formula (e)) and formula (IV) (formula (f)), that is, the aromatic acetylene moiety-containing compounds may likewise be prepared by methods known in the prior art. That is, a compound containing an aromatic acetylene moiety can be obtained by halogenating an aromatic compound, then reacting a suitable substituted acetylene with the halogenated aromatic compound in the presence of an aryl ethynylation catalyst such as a palladium complex.

Commonly known reaction mechanisms for reactions in which the dienophile group-containing compound and the diene group-containing compound serving as precursors are polymerized to form the polyphenylene included in the inventive composition are described below. For example, the preparation process for the above-described oligomer or polymer of formula (II) is generally thought to be represented by the chemical reaction scheme shown in formula (g) below.

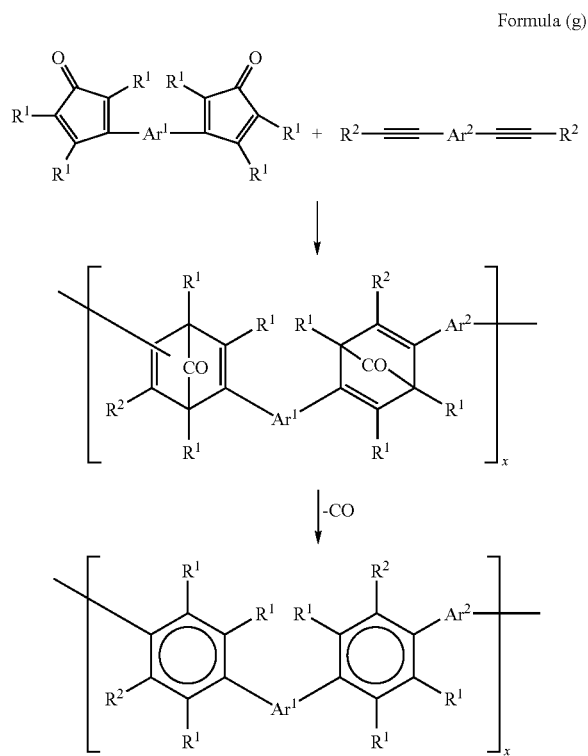

Formula (g)

In formula (g), $R^1$ and $R^2$ have the same meanings as in above formula (I). $Ar^1$ and $Ar^2$ have the same meanings as in above formula (III).

Although not shown in formula (g), depending on the polyphenylene precursors (subsequently defined) that are used and the reaction conditions, carbonyl crosslinked substances may be present in the oligomer or polymer that has been formed as the polyphenylene of the invention. In such a case, with further heating, substantially all of such carbonyl crosslinked substances are believed to convert to aromatic rings. When one or more types of acetylene-containing monomer is used, the structure shown suggests that blocks will form, although the oligomer and polymer that have formed appear to be random. Apparently, a Diels-Alder reaction arises between the cyclopentadienone and the acetylene groups, forming para or meta bonds on the phenylated rings.

The polyphenylene of the invention is thus preferably an oligomer or polymer of one of above formulas (I) to (IV).

The content of the polyphenylene of the invention in the inventive composition, expressed as a ratio of the total solids included in the inventive composition, is preferably from 50 to 90 wt %, more preferably from 70 to 95 wt %, and even more preferably from 80 to 100 wt %.

In the present specification, "total solids included in the inventive composition" refers to all the ingredients except organic solvents.

Next, other ingredients making up the inventive composition are described.

The inventive composition includes an organic solvent which dissolves at least some of the polyphenylene of the invention.

Illustrative examples of the organic solvent include 1-methoxy-2-propanol, propanol, acetylacetone, cyclohexanone, propylene glycol monomethyl ether acetate, butyl acetate, methyl lactate, ethyl lactate, γ-butyrolactone, anisole, mesitylene and t-butylbenzene. Of these, 1-methoxy-2-propanol, cyclohexanone, propylene glycol monomethyl ether acetate, ethyl lactate, γ-butyrolactone, t-butylbenzene and anisole are especially preferred. These may be used singly or as mixtures of two or more thereof.

Also, as described subsequently, the polyphenylene of the invention may be synthesized by adding the polyphenylene precursors to an inert organic solvent and applying heat or the like, in which case the inert organic solvent in the solution following synthesis is the organic solvent mentioned above. The solution obtained by adding polyphenylene precursors to an inert organic solvent and applying heat or the like includes the polyphenylene of the invention, with at least some of the polyphenylene of the invention being dissolved in the inert organic solvent.

The inventive composition may be composed of the polyphenylene of the invention and the above-mentioned organic solvent, although it may additionally include a surfactant. Including a surfactant is desirable because it makes the insulating film formed by the inventive composition easier to adjust to a uniform thickness.

The surfactant is exemplified by nonionic surfactants, anionic surfactants, cationic surfactants, silicone surfactants, fluorocarbon surfactants, polyalkylene oxide surfactants and acrylic surfactants. One of these types of surfactants may be used alone, or two or more different types may be used together. Of these types of surfactants, the use of silicone surfactants, nonionic surfactants, fluorocarbon surfactants and acrylic surfactants is preferred. The use of silicone surfactants is more preferred.

As used herein, "silicone surfactants" refer to surfactants which contain at least one silicon atom. As noted above, it is preferable for the inventive compositions to include a silicone surfactant. Of these, a silicone surfactant having a structure which includes an alkylene oxide and dimethylsiloxane is more preferred. It is even more preferred for a structure of formula (h) below to be included.

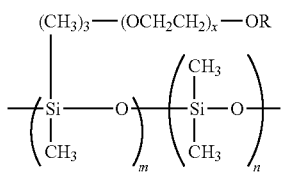

Formula (h)

In formula (h), R is a hydrogen atom or an alkyl group of 1 to 5 carbons, x is an integer from 1 to 20, and m and n are each independently integers from 2 to 100. Each occurrence of R, if plural, may be the same or different.

The above surfactant is included in an amount, based on the total solids within the inventive composition, of preferably from 0.1 to 10 wt %, and more preferably from 1.0 to 5.0 wt %.

The inventive composition may include additives such as a radical generator, colloidal silica, a silane coupling agent, an adherence promoter, and a porogen (pore generating material). The amounts in which these additives are included may be within a range which does not compromise the properties (heat resistance, etc.) of the resulting insulating film, although the content based on the total solids included in the inventive composition is preferably not more than 50 wt %, and more preferably not more than 30 wt %.

In addition, the inventive composition may include a porogen. Including a porogen enables the insulating film formed to be made porous and to be imparted with a low dielectric constant. The content of such a porogen, which must be set within a range allowed by the mechanical strength of the insulating film, is preferably from 0.5 to 50 wt % based on the total solids present in the inventive composition, more preferably from 0.5 to 30 wt %, and even more preferably from 1 to 20 wt %.

The porogen is preferably a nonmetallic compound which is soluble in the above-mentioned organic solvent and is at the same time compatible with the polyphenylene of the invention.

The boiling or decomposition temperature of the porogen is preferably from 100 to 500° C., more preferably from 200 to 450° C., and even more preferably from 250 to 400° C. The weight-average molecular weight is preferably from 200 to 50,000, more preferably from 300 to 10,000, and even more preferably from 400 to 5,000.

Alternatively, if the polyphenylene of the invention includes thermolytic groups, those thermolytic groups act in the same way as the porogen. The thermolytic groups have a decomposition temperature of preferably from 100 to 500° C., more preferably from 200 to 450° C., and even more preferably from 250 to 400° C. The content of thermolytic groups within the polyphenylene included in the inventive composition is preferably from 0.5 to 75 mol %, more preferably from 0.5 to 30 mol %, and even more preferably from 1 to 20 mol %.

The concentration of total solids present in the inventive composition is preferably from 0.1 to 50 wt %, more preferably from 0.5 to 15 wt %, and even more preferably from 1 to 10 wt %.

It is preferable that the content of metals as impurities in the inventive composition be sufficiently low.

The transition metal content in the inventive composition, as measured by inductively coupled plasma mass spectroscopy (ICP-MS), is preferably not more than 10 ppm, more preferably not more than 1 ppm, and even more preferably not more than 100 ppb presumably because transition metals have a high oxidation-promoting catalytic ability, and are believed to increase the dielectric constant of the insulating film (the insulating film of the invention) which is formed from the inventive composition owing to oxidation reactions in the prebake and heat curing processes.

The content of metals other than transition metals in the inventive composition, as measured by ICP-MS, is preferably not more than 30 ppm, more preferably not more than 3 ppm, and even more preferably not more than 300 ppb.

Next, a method of preparing the inventive composition is described.

The polyphenylene included in the inventive composition is prepared by using as the starting materials at least one diene group-containing compound and at least one dienophile group-containing compound. These starting materials are exemplified by the compounds shown in above formulas (a) to (f) (in the case of formula (d), the compounds are the biscyclopentadiene and the diacetylene shown in formula (d)). These starting materials are also referred to in the present specification as "the polyphenylene precursors."

It is preferable for the polyphenylene precursors to be thoroughly purified. It is especially preferable for the polyphenylene precursors to be as free as possible of metals and ionic substances.

For example, if the aromatic acetylene group-containing polyfunctional compound contains residual ethynylation catalyst, the residual ethynylation catalyst can be removed from the polyfunctional compound by rinsing the compound with water, bringing the rinsed compound into contact with an aliphatic hydrocarbon solvent, then dissolving the compound in an aromatic solvent and subsequently passing the solution through a pure silica gel to carry out filtration. By additionally carrying out recrystallization, even further removal of the residual ethynylation catalyst is possible.

Although no limitation is imposed on the method of synthesizing polyphenylene from the above-mentioned polyphenylene precursors, it is preferable to synthesize the polyphenylene by dissolving the polyphenylene precursors in an inert organic solvent, then heating to a suitable polymerization temperature under atmospheric pressure, reduced pressure or an applied pressure. One advantage of this method is that polyphenylene of a uniform molecular weight can easily be obtained, and heat generation associated with the reaction can be mitigated. Another advantage is that the polyphenylene-containing solution obtained in this way is already the inventive composition, thus eliminating the need for such operations as adding polyphenylene to the above organic solvent.

Illustrative examples of the inert organic solvent include mesitylene, pyridine, triethylamine, N-methylpyrrolidinone (NMP), methyl benzoate, ethyl benzoate, butyl benzoate, cyclopentanone, cyclohexanone, cycloheptanone, cyclooctanone, cyclohexylpyrrolidinone; ethers and hydroxyethers such as dibenzyl ether, diglyme, triglyme, diethylene glycol ethyl ether, diethylene glycol methyl ether, dipropylene glycol methyl ether, dipropylene glycol dimethyl ether, propylene glycol phenyl ether, propylene glycol methyl ether and tripropylene glycol methyl ether; and also toluene, mesitylene, xylene, benzene, dipropylene glycol monomethyl ether acetate, dichlorobenzene, propylene carbonate, naphthalene, diphenyl ether, butyrolactone, dimethylacetamide, dimethylformamide and mixtures thereof. Preferred inert organic solvents include mesitylene, N-methylpyrrolidinone (NMP), γ-butyrolactone, diphenyl ether, and mixtures thereof.

The reaction conditions (e.g., reaction temperature, reaction time) under which the polyphenylene precursor polymerization reaction is most advantageously carried out vary depending on various factors such as the polyphenylene precursors and the type of inert organic solvent.

For example, under atmospheric pressure, oligomer can be formed from the polyphenylene precursors at a reaction temperature of from 100 to 475° C. and a reaction time of from 1 minute to 48 hours. The reaction temperature is preferably from 150 to 450° C., and more preferably from 200 to 250° C. The reaction time is preferably from 1 minute to 48 hours, more preferably from 1 minute to 10 hours, and even more preferably from 1 minute to 1 hour. In addition, chain extension (advancement) may be carried out.

The polymerization reaction on the polyphenylene precursors may be carried out in a non-oxidizing atmosphere, such as in nitrogen or some other inert gas.

Next, the insulating film of the invention, which is an insulating film that can be formed from the inventive composition, is described.

First, methods of forming the insulating film of the invention are described.

The insulating film of the invention is preferably formed by applying the inventive composition onto the substrate using any suitable method, such as spin coating, roller coating, dip coating or scanning, and carrying out heat treatment to remove the organic solvent.

The method used for applying the inventive composition onto the substrate is preferably one that involves spin coating or scanning, and more preferably one that involves spin coating. A commercial device may be used for spin coating. For example, advantageous use may be made of the Clean Track series (manufactured by Tokyo Electron Ltd.), the D-Spin series (Dainippon Screen Mfg. Co., Ltd.), or the SS series or CS series (Tokyo Ohka Kogyo Co., Ltd.).

Spin coating may be carried out at any spin rate. However, when coating onto a 300 mm silicon substrate, for example, a spin rate of about 1,300 rpm is preferred because the insulating film of the invention that is thus formed has a good in-plane uniformity.

The method of discharging the inventive composition may be either dynamic discharge in which the inventive composition is discharged onto a spinning substrate, or static discharge in which the inventive composition is discharged onto a stationary substrate. However, from the standpoint of achieving a good in-plane uniformity in the insulating film of the invention that is formed, dynamic discharge is preferred. Also, to hold down the consumption of the inventive composition, use may be made of a process in which an organic solvent to contain the inventive composition is initially discharged onto the substrate so as to form a liquid film, after which the inventive composition is discharged onto the liquid film. Here, in cases where two or more different organic solvents are included, the liquid film may be formed using only the organic solvent present in the highest content. The spin coating time is not subject to any particular limitation, although a spin coating time of not more than 180 seconds is preferable from the standpoint of throughput. For good transport of the substrate, it is preferable to carry out treatment (edge rinsing, back rinsing) intended to prevent film from remaining at the edges of the substrate.

The heat treatment method is not subject to any particular limitation. For example, suitable use may be made of such commonly used techniques as hot plate heating, heating methods involving the use of a furnace, or light irradiation heating with a xenon lamp, such as by means of a rapid thermal processor (RPT). Of these, hot plate heating and heating methods involving the use of a furnace are preferred.

Commercially available devices may be advantageously used as the hot plate. Desirable examples include the Clean Track series (manufactured by Tokyo Electron Ltd.), the D-Spin series (Dainippon Screen Mfg. Co., Ltd.), and the SS series or CS series (Tokyo Ohka Kogyo Co., Ltd.). Furnaces that may be preferably used include the a series (Tokyo Electron Ltd.).

The polyphenylene included in the inventive composition is preferably cured by heat treatment following application onto the substrate. For example, by subjecting the carbon triple bonds and double bonds remaining on the polyphenylene present in the inventive composition to a polymerization reaction at the time of heat treatment, the strength of the insulating film that is formed can be increased. The conditions for such heat treatment are a temperature of preferably from 100 to 450° C., more preferably from 200 to 420° C., and even more preferably from 350 to 400° C.; and a treatment time of preferably from 1 minute to 2 hours, more preferably from 10 minutes to 1.5 hours, and even more preferably from 30 minutes to 1 hour.

Heat treatment may be carried out as a plurality of discrete heat treatment steps. Also, to prevent thermal oxidation by oxygen, it is preferable to carry out such heat treatment under a nitrogen atmosphere.

Alternatively, following application of the inventive composition to the substrate, instead of the above-mentioned type of heat treatment, the carbon triple bonds and double bonds remaining on the polyphenylene present in the inventive composition may be subjected to a polymerization reaction by exposure to high-energy radiation.

As used herein, "high-energy radiation" includes, but is not limited to, electron beams, ultraviolet light and x-rays.

When electron beams are used as the high-energy radiation, the energy level is preferably from 0 to 50 keV, more preferably from 0 to 30 keV, and even more preferably from 0 to 20 keV. The total electron beam dose is preferably from 0 to 5 $\mu$C/cm$^2$, more preferably from 0 to 2 $\mu$C/cm$^2$, and even more preferably from 0 to 1 $\mu$C/cm$^2$. The substrate temperature during exposure to electron beams is preferably from 0 to 450° C., more preferably from 0 to 400° C., and even more preferably from 0 to 350° C. The atmospheric pressure during exposure to electron beams is preferably from 0 to 133 kPa, more preferably from 0 to 60 kPa, and even more preferably from 0 to 20 kPa.

To prevent oxidation of the polyphenylene present in the inventive composition, it is preferable to use an inert atmosphere such as argon, helium or nitrogen as the atmosphere surrounding the substrate at the time of electron beam exposure. Alternatively, gases such as oxygen, hydrocarbons and ammonia may be added for reaction with the plasma, electromagnetic waves and chemical species generated by interactions with the electron beams.

Electron beam exposure may be carried out a plurality of times. In such a case, it is not necessary for the same electron beam irradiation conditions to be used each time; irradiation may be carried out under different conditions each time.

Ultraviolet light may be used as the high-energy radiation. When ultraviolet light is used, the radiation wavelength region is preferably from 160 to 400 nm and the output directly over the substrate is preferably from 0.1 to 2000 mWcm$^{-2}$. The substrate temperature at the time of ultraviolet light irradiation is preferably from 250 to 450° C., more preferably from 250 to 400° C., and even more preferably from 250 to 350° C. To prevent oxidation of the polyphenylene present in the inventive composition, it is preferable to use an inert atmosphere of argon, helium, nitrogen or the like as the atmosphere surrounding the substrate at the time of ultraviolet light irradiation. The pressure at the time of ultraviolet light irradiation is preferably from 0 to 133 kPa.

The insulating film of the invention can be formed using methods such as those described above. The thickness of the insulating film of the invention, while not subject to any particular limitation, is preferably from 0.01 to 10 μm, more preferably from 0.02 to 5 μm, and even more preferably from 0.03 to 1 μm.

Here, the thickness of the insulating film of the invention is defined as the simple arithmetic average of measurements taken at three or more randomly selected places using an optical interference film thickness gauge.

When the insulating film of the invention is used as an interlayer dielectric for semiconductor devices, the interconnect structure may have, at the interconnect sidewalls, a barrier layer for preventing metal migration; and may additionally have, at the top and bottom faces of the interconnects and the interlayer dielectric, capping layers and interlayer adhesion layers for preventing delamination during chemical mechanical polishing (CMP), as well as other layers such as etching stopper layers. Moreover, the interlayer dielectric may, if necessary, be divided into a plurality of layers composed of different materials.

A commercial slurry (such as one produced by Fujimi Incorporated, Rodel-Nitta Company, JSR Corporation or Hitachi Chemical Co., Ltd.) may be suitably used as the CMP slurry. Commercially available equipment (such as equipment manufactured by Applied Materials, Inc. or Ebara Corporation) may be used as the CMP tool.

In addition, washing may be carried out to remove slurry residues following CMP.

The insulating film of the invention may be etched to form copper lines or for other purposes. Either wet etching or dry etching may be used, although dry etching is preferred. Either an ammonia plasma or a fluorocarbon plasma may be suitably used for dry etching. In this plasma, aside from argon, it is possible to use other gases such as oxygen, nitrogen, hydrogen and helium. Following the etching operation, ashing may be carried out to remove the photoresist, etc. used in etching. In addition, washing may be carried out to remove ashing residues.

The insulating film of the invention may be used for a variety of purposes. For example, it is well-suited for use as an insulating film in semiconductor devices such as LSIs, system LSIs, DRAMs, SDRAMs, RDRAMs and D-RDRAMs, and in electronic components such as multichip modules and multilayer wiring boards. In addition, the inventive insulating film may be used in semiconductor devices as interlayer dielectrics, etching stopper films, surface protection films and buffer coating films, in LSIs as passivation films and films for blocking a radiation, in flexo printing plates as coverlay films and overcoat films, as cover coats for flexible copper-clad substrates, as solder resist films, and as liquid crystal orientation films.

EXAMPLES

The insulating film-forming compositions of the invention are illustrated more fully below by way of working examples, although the invention is not limited by the examples.

Synthesis Example 1

Synthesis of 1,2,4-Tris(2-(3-methoxyphenyl)ethynyl) benzene (Compound (a))

1,2,4-Tribromobenzene (20.0 g, 63.5 mmol) was added to 300 mL of triethylamine, following which the resulting liquid mixture was deaerated by bubbling through dry nitrogen for 30 minutes.

Next, triphenylphosphine (2.2 g, 8.36 mmol), palladium (II) acetate (0.100 g, 0.445 mmol) and copper (I) iodide (0.315 g, 1.65 mmol) were added thereto, and the resulting mixture was refluxed under heating.

Next, 1-ethynyl-3-methoxybenzene (26.04 g, 197 mmol) was added over a period of 10 minutes. The reaction mixture was then refluxed overnight under heating. The resulting reaction mixture was cooled to room temperature, following which pure water and 300 mL of toluene were added. Using a separatory funnel, the target product was extracted with toluene, and the resulting toluene solution was concentrated. The concentrated solution was subjected to silica gel column chromatography (toluene) and thereby purified, and the fractions containing the target product were concentrated and dried to afford the target compound (a) in a yield of 45%.

Synthesis Example 2

Synthesis of 1,3-Bis(3-methoxyphenyl)acetylene (Compound (b))

Aside from using 1-bromo-3-methoxybenzene instead of 1,2,4-tribromobenzene as the reaction substrate, the same procedure was followed as in Synthesis Example 1, yielding Compound (b).

Synthesis Example 3

3,3'-(Oxydi-1,4-phenylene)bis(2,4,5-triphenylcyclopentadienone (Compound (c), 7.83 g, 0.010 mol) and 1,2,4-Tris (2-(3-methoxyphenyl)ethynyl)benzene (Compound (a), 7.03 g, 0.015 mol) obtained in Synthesis Example 1 above were dissolved in 50 ml of γ-butyrolactone, and the resulting solution was added to a flask. The interior of the flask was flushed with nitrogen and the solution was stirred while heating at 200° C. After 12 hours of heating, the solution was cooled to room temperature and 50 mL of ethanol was added thereto. Polyphenylene (A-1) as the product of the Diels-Alder reaction between Compound (a) and Compound (c) was obtained at this time by precipitation in the form of a powdery solid. This Polyphenylene (A-1) had a weight-average molecular weight, measured as the polystyrene equivalent molecular weight by gel-permeation chromatography (GPC), of 21,100.

Synthesis Example 4

Aside from using the reaction substrates shown in Table 1 below instead of 3,3'-(oxydi-1,4-phenylene)bis(2,4,5-triphenylcyclopentadienone (Compound (c)) and 1,2,4-Tris(2-(3-methoxyphenyl)ethynyl)benzene (Compound (a)), Polyphenylene (A-2) and, for the sake of comparison, Polyphenylene (A-3), were obtained by following the same procedure as in Synthesis Example 3 above. Table 1 also shows the structures and number of moles of the starting monomers used to obtain Polyphenylene (A-2) and Polyphenylene (A-3), and the weight-average molecular weights (GPC-based polystyrene-equivalent molecular weights) of the polymers obtained.

Measurement of Oxygen Ratio in Polyphenylene (A)

Polyphenylenes (A-1) to (A-3) obtained as described in the foregoing synthesis examples were dissolved in high-purity, electronics industry-grade, cyclohexanone to a concentration of 4 wt % so as to form casting solutions.

The casting solutions were spin-coated onto 8-inch bare silicon wafers using an ACT-8 SOD spin coater manufactured by Tokyo Electron Ltd. The films obtained after coating were baked at 110° C. for 60 seconds on a hot plate mounted on the above apparatus, subsequently baked at 200° C. for 60 seconds on the hot plate, then cured at 350° C. for 5 minutes on the hot plate under a low-oxygen concentration (oxygen concentration, less than 100 ppm), thereby giving a 100 nm thick coat. The number of carbon atoms (C atm %) and the number of oxygen atoms (O atm %) present in the coat thus obtained were measured using the x-ray photoelectron spectroscopy (XPS) measurement system PHI Quantum 2000 (Ulvac-Phi, Inc.; x-ray source, Al—Kα line; x-ray incidence angle, 450). The results are summarized below in Table 1.

TABLE 1

| Polyphenylene (A) | Starting monomer (1) | Starting monomer (2) |
|---|---|---|
| (A-1) | 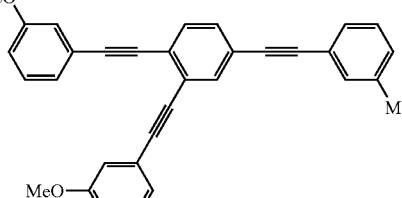<br>(a): 0.015 mol | 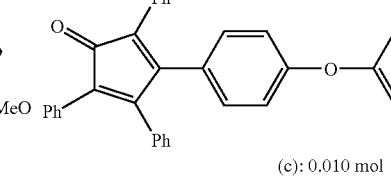<br>(c): 0.010 mol |
| (A-2) | 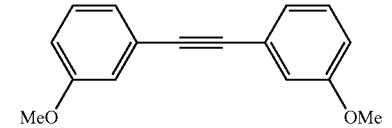<br>(b): 0.040 mol | <br>(d): 0.010 mol |
| (A-3) | 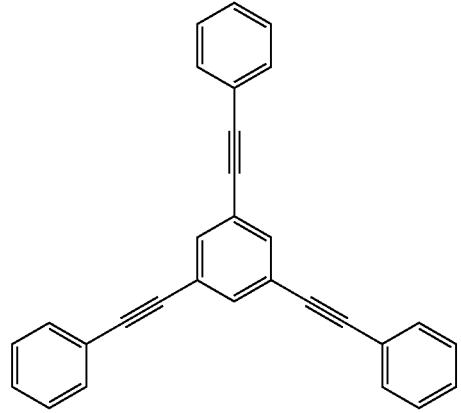<br>(e): 0.010 mol | 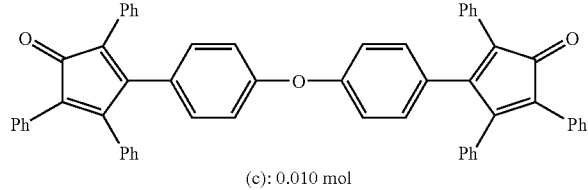<br>(c): 0.010 mol |

| Polyphenylene (A) | Starting monomer (3) | Weight-average molecular weight (Mw) of Polyphenylene (A) | Elemental composition of film composed solely of Polyphenylene (A) | |
|---|---|---|---|---|
| | | | Carbon (C, atom %) | Oxygen (O, atom %) |
| (A-1) | — | 21100 | 94.7 | 5.3 |
| (A-2) | 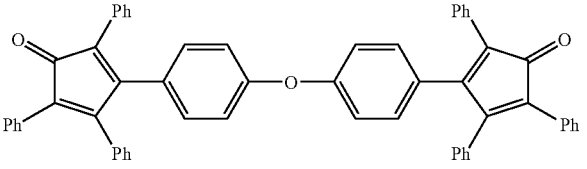<br>(c): 0.020 mol | 15600 | 94.9 | 5.1 |
| (A-3) | — | 21000 | 97.9 | 2.1 |

Examples 1 to 10, Comparative Example 1

Preparation of Insulating-Film-Forming Composition

Insulating film-forming compositions were prepared by adding 1 wt % of a vinyltrimethoxysilane oligomer (VMM010, available from Gelest, Inc.) as the silane coupling agent to each of the Polyphenylenes (A-1) to (A-3) obtained in the above synthesis examples, and effecting complete dissolution in a solvent (B) to a solids concentration of 3.0 wt %. The contents of the insulating film-forming compositions thus prepared are shown in Table 2. The symbols for the solvents (B-a) to (B-d) in Table 2 have the following meanings: (B-a), cyclohexanone; (B-b), 2-heptanone; (B-c), γ-butyrolactone; (B-d), NMP. The numbers in the solvent (B) column in Table 2 indicate the amounts (wt %) in which the respective solvents were added. For example, in Example 1, (B-a) was added in an amount of 8 wt % with respect to Polyphenylene (A-1).

Measurement of Film Dielectric Constant

The casting solution prepared as described above in each example was spin-coated onto a 8-inch bare silicon wafer having a substrate resistance of 7 Ω/cm using an ACT-8 SOD spin coater manufactured by Tokyo Electron Ltd. The film obtained after coating was baked at 110° C. for 60 seconds, then baked at 200° C. for 60 seconds, and subsequently fired at 400° C. for 1 hour in a clean oven flushed with nitrogen, thereby giving a 100 nm thick coat. The relative dielectric constant of the resulting film was computed from the electric capacitance measured at 1 MHz using a mercury probe manufactured by Four Dimensions, Inc. and an HP4285A LCR meter manufactured by Yokogawa-Hewlett Packard, Ltd. The results are shown in Table 2.

Evaluation of Adherence to Overlying Inorganic Film

The casting solution prepared as described above in each example was applied onto an 8-inch bare silicon wafer using an ACT-8 SOD spin coater manufactured by Tokyo Electron Ltd. The film obtained after coating was baked at 110° C. for 60 seconds, then at 200° C. for 60 seconds, and subsequently fired for 1 hour in a nitrogen-flushed clean oven at 400° C., thereby giving a 100 nm thick coat. Using a Plasma Enhanced Chemical Vapor Deposition (PECVD) Producer CVD (Applied Materials, Inc.), a carbon-containing silicon oxide (SiOC) film was formed to a thickness of 30 nm. After deposition of the CVD-SiOC film, cellophane tape (Scotch® tape No. 610, produced by 3M Company) was affixed to the SiOC film, following which the tape was pulled up and an evaluation was carried as to whether separation occurred at the interface between the polyphenylene layer and the CVD-SiOC layer. When separation occurred, even if only in places, the sample was rated as "NG"; when no separation occurred whatsoever, the sample was rated as "Good." The results are shown in Table 2.

TABLE 2

| | Polyphenylene (A) | Solvent (B) | Porogen | Dielectric constant | Adherence to overlying CVD-SiOC film |
|---|---|---|---|---|---|
| EX 1 | (A-1) | (B-a):(B-c) = 8:1 | — | 2.70 | good |
| EX 2 | | (B-a) | — | 2.69 | good |
| EX 3 | | (B-b) | — | 2.72 | good |
| EX 4 | | (B-a):(B-c) = 8:1 | added (10 wt %) | 2.45 | good |
| EX 5 | | (B-a):(B-c) = 8:1 | added (20 wt %) | 2.23 | good |
| EX 6 | (A-2) | (B-a):(B-d) = 8:2 | — | 2.58 | good |
| EX 7 | | (B-a) | — | 2.55 | good |
| EX 8 | | (B-b) | — | 2.60 | good |
| EX 9 | | (B-a):(B-c) = 8:1 | added (10 wt %) | 2.35 | good |
| EX 10 | | (B-a):(B-c) = 8:1 | added (20 wt %) | 2.15 | good |
| CE 1 | (A-3) | (B-a):(B-c) = 8:1 | — | 2.68 | NG |

As is apparent from Table 2 above, the compositions of the present invention are compositions capable of forming insulating films which have a low dielectric constant and which have a high adherence to the overlying inorganic insulating film layer.

What is claimed is:

1. A composition for forming an insulating film containing polyphenylene, wherein the polyphenylene in an insulating film formed from the composition has a number of carbon atoms (C) and a number of oxygen atoms (O) which together satisfy a condition O/(C+O)≧0.050, wherein the polyphenylene is a compound formed by a Diels-Alder reaction between a diene group-containing compound and a dienophile group-containing compound, and wherein one or both of the diene group-containing compound and the dienophile group-containing compound contain ether groups such that the diene group-containing compound and the dienophile group-containing compound together contain a total number of at least 4 ether groups.

2. The composition of claim 1, wherein each of the ether groups is methoxy group, phenyl ether group or trifluoromethyl ether group.

3. The composition of claim 2, wherein each of the ether groups is methoxy group.

* * * * *